United States Patent [19]
Roy et al.

[11] Patent Number: 5,912,801
[45] Date of Patent: Jun. 15, 1999

[54] TELECOMMUNICATION SWITCH CHASSIS

[75] Inventors: Christopher E. Roy, Plymouth; Kathleen M. Lacey, Mashpee; Lori B. Pass, Cotuit, all of Mass.

[73] Assignee: Excel, Inc., Hyannis, Mass.

[21] Appl. No.: 08/936,489

[22] Filed: Sep. 16, 1997

[51] Int. Cl.⁶ .............................. H05K 7/20; H05K 1/14; H05K 5/00

[52] U.S. Cl. .......................... 361/690; 361/678; 361/679; 361/688; 361/695; 361/736; 361/741; 312/223.1; 312/223.2; 454/184; 454/185; 454/186

[58] Field of Search .................................. 361/600, 678, 361/679, 688, 690, 695, 726, 727, 736, 741; 454/184, 185, 186; 312/223.1, 223.2; 165/80.3, 80.2, 185

[56] References Cited

U.S. PATENT DOCUMENTS

| | | |
|---|---|---|
| D. 349,503 | 8/1994 | Roy . |
| 4,489,363 | 12/1984 | Goldberg ................................. 361/383 |
| 4,901,200 | 2/1990 | Mazura .................................... 361/379 |
| 5,010,450 | 4/1991 | Werdin et al. ........................... 361/415 |
| 5,398,161 | 3/1995 | Roy . |
| 5,424,915 | 6/1995 | Katooka et al. ......................... 361/695 |
| 5,613,906 | 3/1997 | Kikinis .................................... 454/184 |

*Primary Examiner*—Leo P. Picard
*Assistant Examiner*—Anatoly Vortman
*Attorney, Agent, or Firm*—Cesari and McKenna, LLP

[57] ABSTRACT

A telecommunications switch chassis includes a housing which is divided into front and rear compartments by a transverse printed circuit board or mid-plane. Notches are provided in the upper edges of the mid-plane which are adapted to receive tabs projecting from the ends of a pair of card guides so that the card guides are supported on edge in proper laterally spaced relation within the front compartment. The card guides are formed with columns of slots whose edges are deformed to form slides interleaved with the slots so that the card guides can support a stack of printed circuit cards in vertical spaced relation within the front compartment, the spaces between the cards being aligned with the slots in the card guides. Card connectors are mounted to the printed circuit board, the connectors being aligned with the slides of the card guides so that when printed circuit cards are seated in the slides, end connectors on those cards mate with the corresponding connectors on the mid-plane so that reliable electrical connections via the mid-plane are made between all of the cards in the chassis. The chassis also includes a fan module in the front compartment which directs high pressure air across the front compartment between the printed circuit cards therein which air flows rearwardly into the rear compartment and between similarly stacked printed circuit cards in the rear compartment following a generally U-shaped path through the housing so that all electrical components on all of the cards are cooled properly.

16 Claims, 7 Drawing Sheets

TELECOMMUNICATION SWITCH CHASSIS

This invention relates to a telecommunication switch. It relates more particularly to a switch chassis having optimum characteristics for DFA and DFM.

BACKGROUND OF THE INVENTION

A telecommunication switch as used to write message traffic over a network. Usually, it comprises a chassis or housing containing circuitry on a multiplicity of printed circuit cards which plug into a motherboard in the chassis. The various communication lines are plugged into connectors on those cards, the connectors being exposed at the back and/or front of the chassis. The actual switching may be controlled by a central processor unit (CPU) contained on one or more of the cards in accordance with programs and instructions provided from an external keyboard. The chassis usually also contains a power supply for supplying power to various parts of the switch.

Many present day switch chassis and housings are disadvantaged in that they are relatively difficult to make and to assemble so that when the various printed circuit cards are installed in the chassis, they will assuredly make good reliable electrical connections to the motherboard. Also, the interiors of the prior chassis are not always organized to promote good circulation of cooling air through the chassis so that components on all of the cards, particularly the power cards are adequately cooled. Furthermore, the interior layouts of conventional chassis are usually not flexible enough to allow for using redundant power supplies or take into account that some switches may require more switching capacity than others.

SUMMARY OF THE INVENTION

Accordingly, the present invention aims to provide a chassis for a telecommunications switch that facilitates proper insertion of the printed circuit cards that make up the switch.

Another object of the invention is to provide a switch chassis of this type which assures reliable electrical connections between the motherboard in the switch chassis and the various printed circuit cards that are inserted into the chassis.

Yet another object of the invention is to provide a telecommunications switch chassis whose motherboard constitutes a mid-plane such that printed circuit cards can be plugged into both sides of the motherboard.

A further object of the invention is to provide a telecommunications switch chassis having a self-aligning mid-plane card guide junction.

A further object of the invention is to provide a switch chassis whose internal layout allows highly efficient cooling of the various power modules and printed circuit cards installed in the chassis.

Another object of the invention is to provide such a switch chassis which is relatively easy to manufacture and to assemble on a production line basis.

Other objects will, in part, be obvious and will, in part, appear hereinafter.

The invention accordingly comprises the features of construction, combination of elements and arrangement of parts which will be exemplified in the following detailed description, and the scope of the invention will be indicated in the claims.

Briefly, my switch chassis comprises a rugged generally U-shaped housing having a bottom wall and a pair of upstanding sidewalls. The interior of the housing is divided into front and rear compartments by a transverse printed circuit motherboard constituting a mid-plane which extends almost the entire width of the housing. Extending forwardly from the mid-pane to the front of the housing is a pair of laterally spaced-apart card guides. The card guides extend the full height of the housing and are formed with columns of relatively large horizontal slots. The top and bottom edges of adjacent slots in each column are bent toward one another so as to form a column of slides interleaved with the slots for supporting the opposite side edges of a stack or column of printed circuit cards positioned between the card guides. Thus, the card guide slots are aligned with the spaces between printed circuit cards in the stack so that air can circulate between the cards in the front compartment from one side of the housing to the other.

The mid-plane or motherboard carries printed circuit paths and card connectors which are arranged to connect to mating end connectors on the printed circuit cards supported by the card guides. As will be described in more detail later, the card guides and mid-plane are self-aligning so that when a printed circuit card is inserted into its slides in the card guides, the card will slide smoothly to its home position in the chassis and the connector(s) on that card will assuredly mate with the corresponding connector(s) on the mid-plane so that good reliable electrical connections are made between the card and the mid-plane. As will be seen also, provision is made for locking each card in place so that there are no electrical interruptions due to vibration and jostling of the chassis.

Preferably, the lowest card positions in the front compartment of the housing are filled by a pair of side-by-side power supply cards or modules. The outer side edges of those cards are supported by the lowest slots in two card guides. On the other hand, the inner adjacent edges of the two power supply cards are slidably supported by a guide rail extending up from the bottom wall of the housing in the front compartment thereof. Preferably, a door is provided at the front of the housing that may be closed and secured after the power supply modules are inserted into the chassis to protectively enclose those modules whose components may carry dangerous high voltage.

The rear compartment of the housing also contains a pair of laterally spaced-apart card guides which are similar to the card guides in the front compartment in that they are formed with interleaved slots and slides as described above so that the card guides can support a stack of printed circuit cards in the rear compartment. Again, the spaces between the cards are aligned with the slots in the card guides and so that end connectors on the printed circuit cards can mate with corresponding card connectors in the rear face of the midplane.

A cover is provided to close the open top of the housing. Therefore, to assure adequate ventilation for the housing contents, a fan module is provided in the front compartment in a utility space between one card guide and the adjacent housing wall. The module receives power via a connector which plugs into a mating connector on the midplane. When in operation, the fans of the fan module draw in air through a perforate door at the front of the housing and directs cooling air forcefully, laterally across the front compartment through the slots in the card guides and between and around the printed circuit cards in the front compartment. The transverse motherboard functions as a baffle so that the cooling air is directed toward the opposite wall of the front compartment and then rearwardly around an edge of the motherboard into the rear compartment. From there, the cooling air is directed through the slots of the card guides in the rear compartment and between the printed circuit cards therein whereupon it exits the housing through a vent opening in the rear compartment behind the fan module. Thus, the cooling air is forced to follow a generally U-shaped path within the housing so that it reaches all of the components on the various printed circuit cards in the front and rear compartments of the chassis and particularly the power supply cards at the bottom of the front compartment.

The on/off switches and other controls necessary to operate the switch are located at the rear of the housing. On the other hand, the switch signal inputs and outputs are conveniently located on the ends of the various printed circuit cards exposed at the front and rear of the housing. The necessary indicator lights and displays are similarly located so that they are readily visible to service personnel at the vicinity of the switch.

As will be seen from the following detailed description, the components of the chassis are relatively easy and inexpensive to make and to assemble and the chassis construction allows considerable flexibility in the make-up of the switch in terms of the number and type of power supplies, and the number and type of the line cards, etc. All of these features should make the chassis a very marketable piece of telecommunications equipment.

BRIEF DESCRIPTION OF THE DRAWINGS

For a fuller understanding of the nature and objects of the invention, reference should be had to the following detailed description, taken in connection with the accompanying drawing, in which.

DETAILED DESCRIPTION OF AN ILLUSTRATIVE EMBODIMENT

Figure 1:
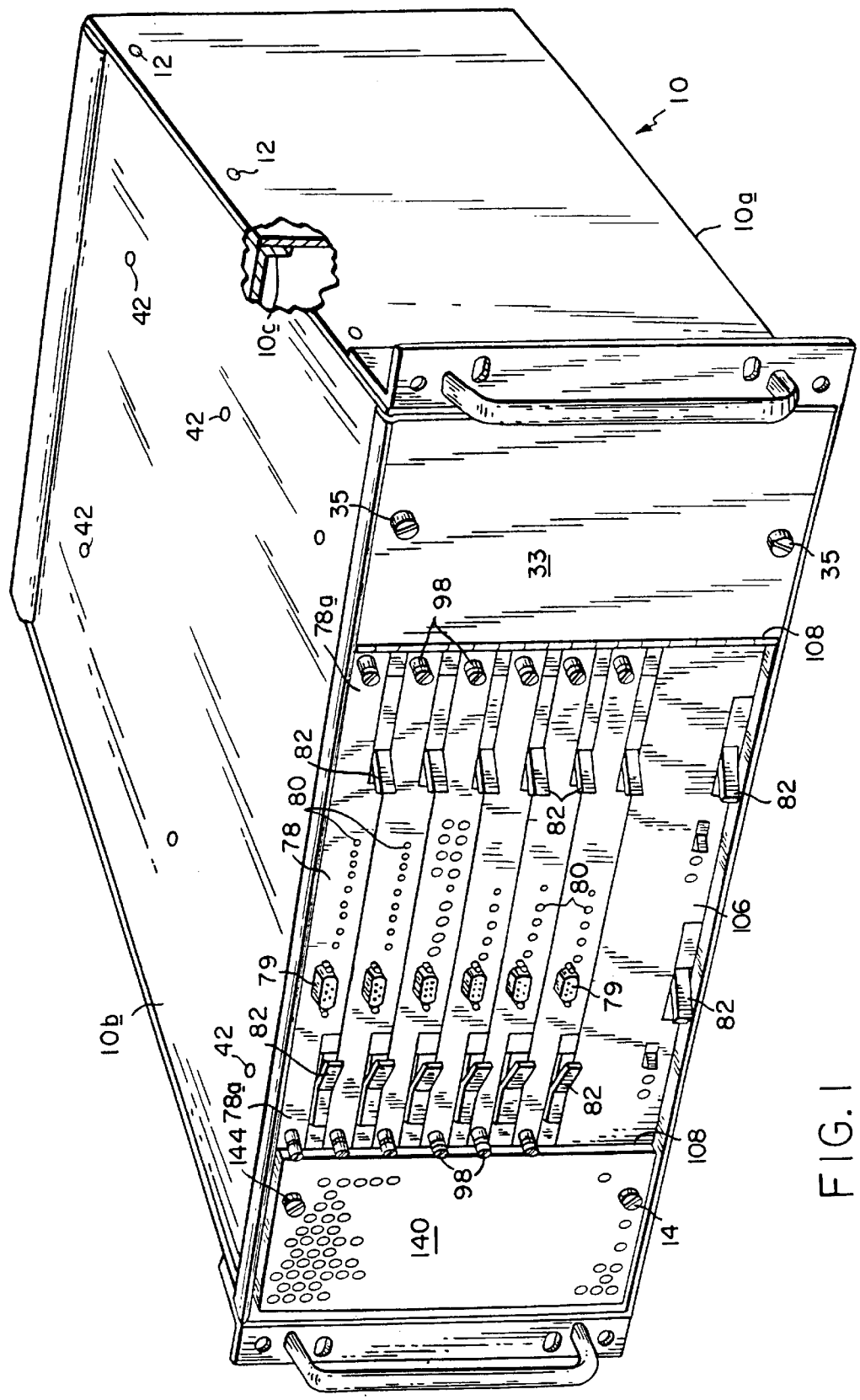
FIG. 1 is a left-front perspective view from above, with parts broken away, showing a telecommunications switch chassis embodying the invention.
Figure 2:
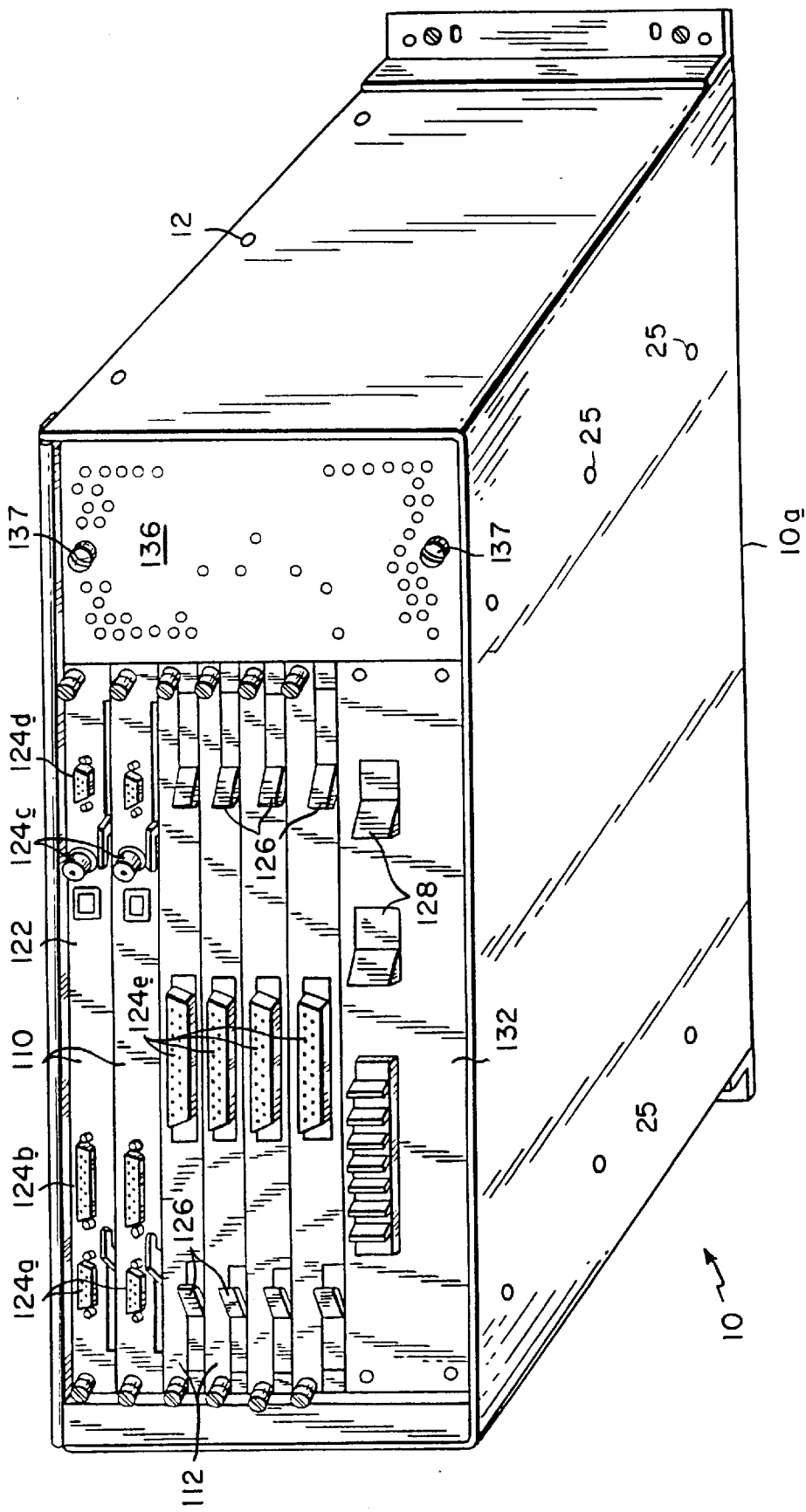
FIG. 2 a right-rear perspective view from below of the FIG. 1 switch.
Figure 3:
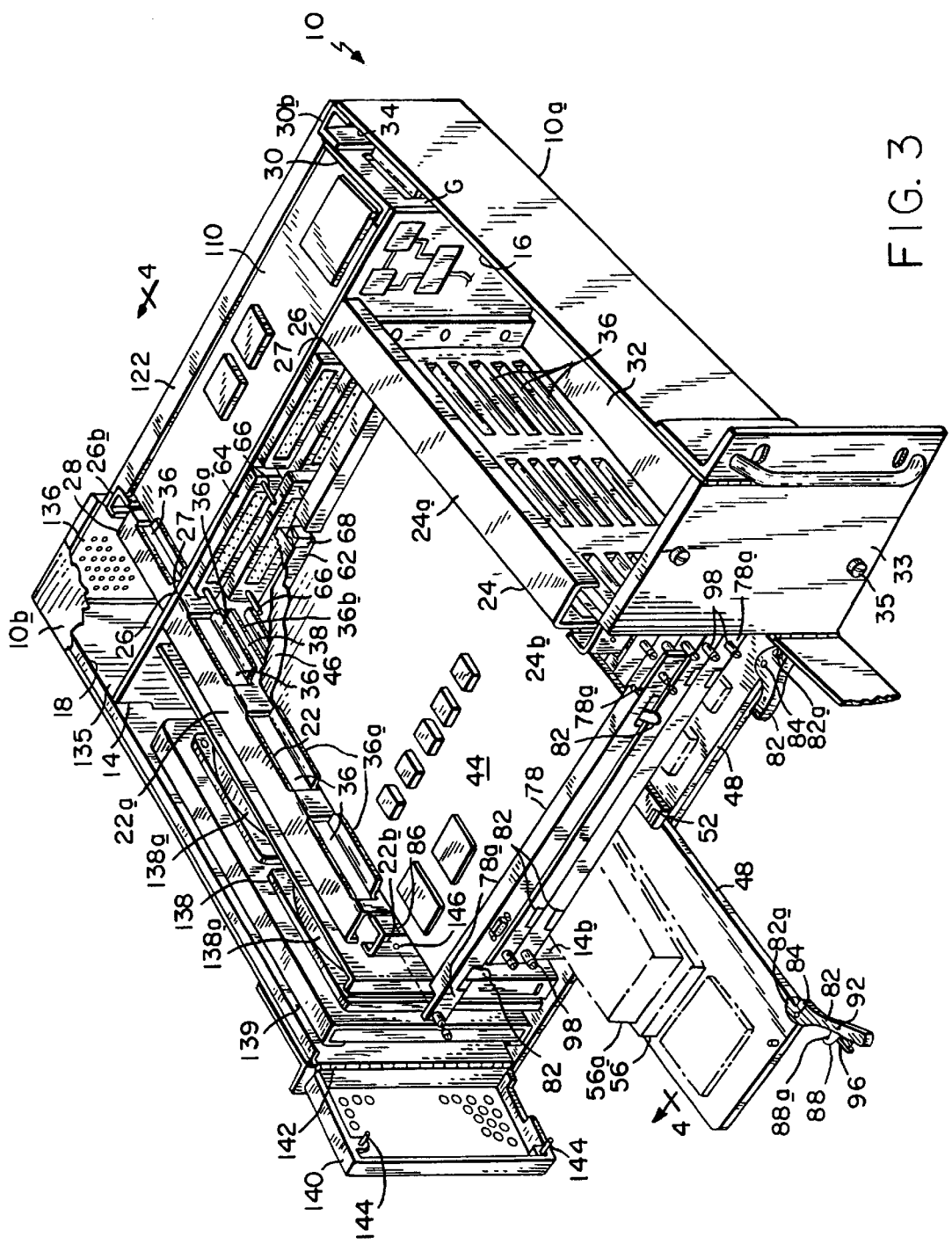
FIG. 3 is a view similar to FIG. 1 with parts broken away showing the interior of the switch chassis is in greater detail.

Referring to FIGS. 1 to 3 of the drawings, the chassis includes a housing or enclosure 10 composed of a generally U-shaped channel 10a which forms the bottom and sidewalls of the housing. The housing also has a flat top wall or cover 10b with depending side flanges 10c to which the upper side edges of the channel 10a are connected by threaded fasteners 12. While the chassis is shown with cover 10b facing up, in use, the chassis may be mounted in a rack on its side.

Positioned edgewise in channel 10a is a transverse printed circuit motherboard constituting a mid-plane 14. The motherboard extends the full height of the channel and extends from the right hand sidewall thereof almost to the left hand sidewall, leaving a gap G between the motherboard and the left hand wall of the channel. The mid-plane is situated about two-thirds of the way back along the channel so that it effectively divides the interior of the housing into a relatively large front compartment 16 and a smaller rear compartment 18. The mid-plane is actually mounted to the rear ends of a pair of laterally spaced-apart, parallel, mirror-image card guides 22 and 24 positioned edgewise in compartment 16. The card guides 22 and 24 extend from the mid-plane 14 almost to the front of the housing channel 10a and their bottom edges are secured to the bottom wall of the channel by suitable fasteners 25 (FIG. 2) so that the card guides remain upstanding in compartment 16.

Figure 4:
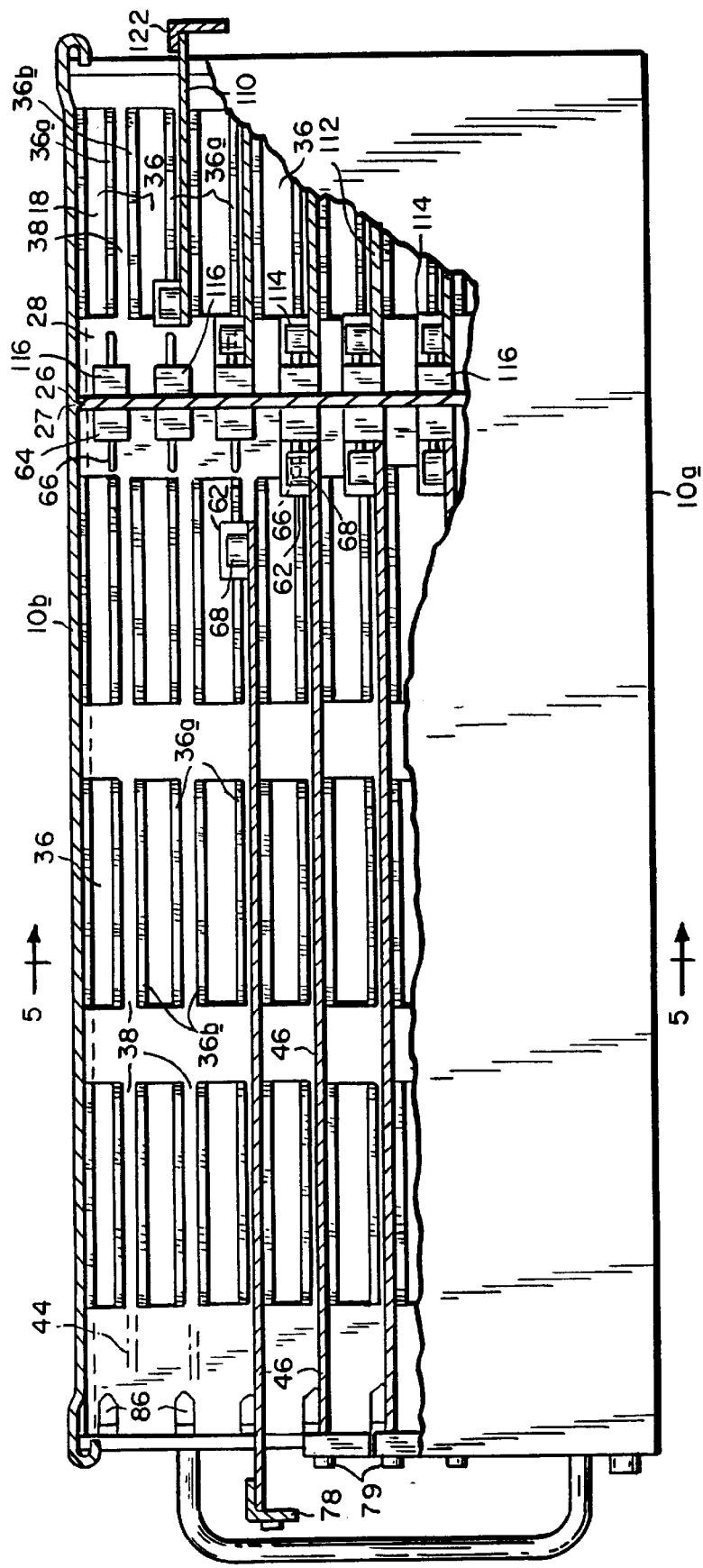
FIG. 4 is a sectional view taken along line 4—4 of FIG. 3.
Figure 6A:
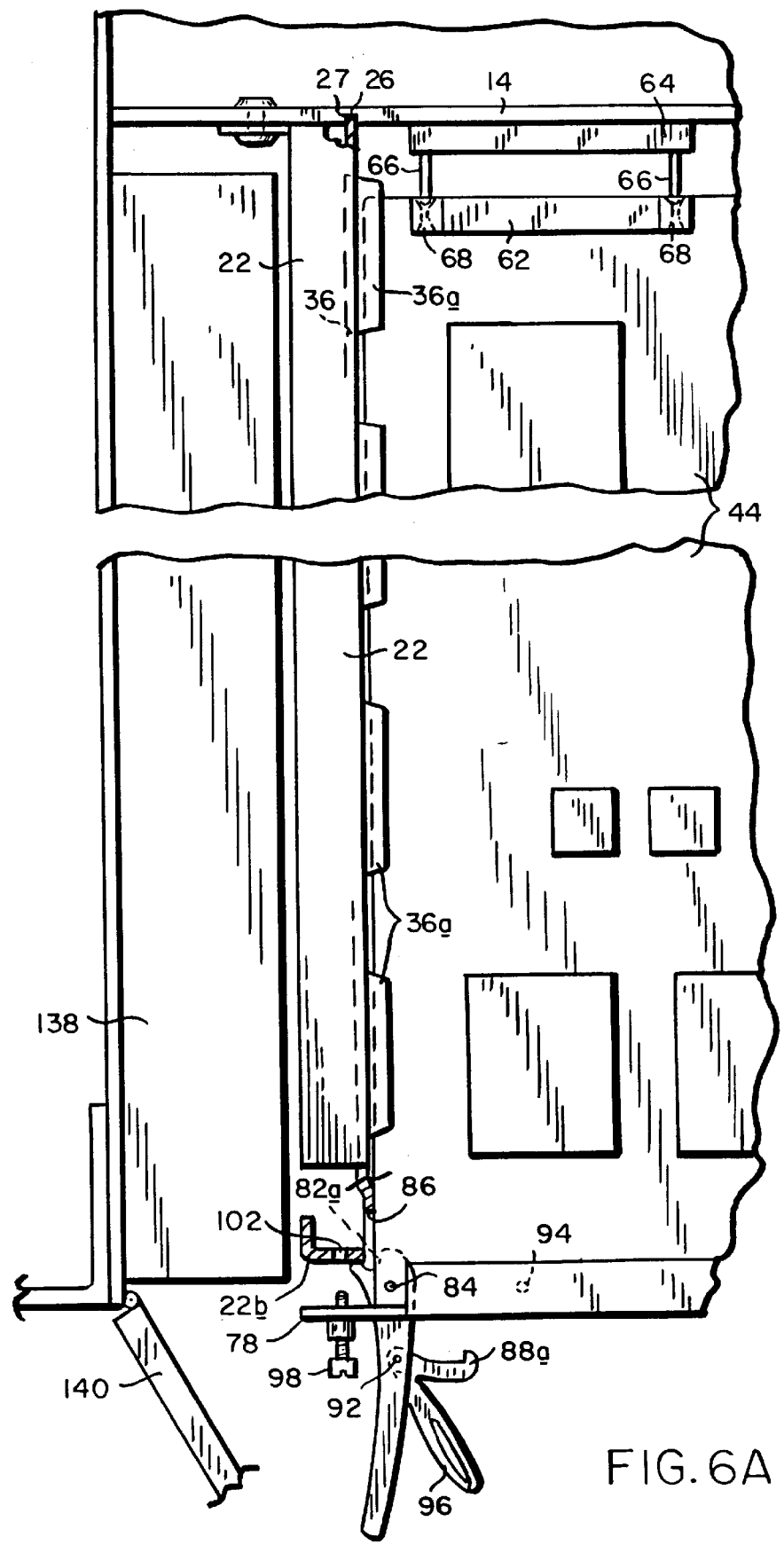
FIGS. 6A and 6B are fragmentary plan views on a larger scale showing a typical printed circuit card in the chassis partially and fully seated, respectively.

As best seen in FIGS. 4 and 6A, a pair of slots 26 are formed in the upper and lower edges of the mid-plane 14. These slots mark the proper positions for the card guides 22 and 24 relative to the mid-plane. Also, small triangular (in vertical aspect) tabs 27 project from the rear ends of the card guides at the tops and bottoms thereof. When assembling the card guides and mid-plane, these tabs 27 are inserted into the slots 26 before the mid-plane is secured to the rear edges of the card guides by suitable threaded fasteners (not shown). This assures that the card guides are always aligned properly with the mid-plane so that the cards supported by the card guides will slide smoothly and be positioned properly relative to the card connections on the mid-plane as will be described presently.

As shown in FIGS. 3 and 4, a similar, but smaller pair of card guides 28 and 30 are located in rear compartment 18 extending from mid-plane 14 almost the rear edge of channel 10a the card guides being secured to the channel bottom wall by fasteners 25 (FIG. 2). While the right hand card guide 28 in compartment 18 is an alignment with card guide 22 in compartment 16, the left hand card guide 30 is located closer to the left side-wall of channel 10a than is the left hand card guide 24 in the front compartment. This allows the rear compartment 18, with less rearward extent, to accept wider printed circuit cards than compartment 16. This arrangement also provides a relatively wide utility space or plenum 32 at the left side of the front compartment 16. A panel 33 secured to the front of housing 10 by fasteners 35 walls off the front of plenum 32 but the plenum communicates via gap G with a narrower utility space 34 at the left side of the rear compartment 16. As will be seen, this helps to assure good circulation of cooling air through the housing.

Figure 5:
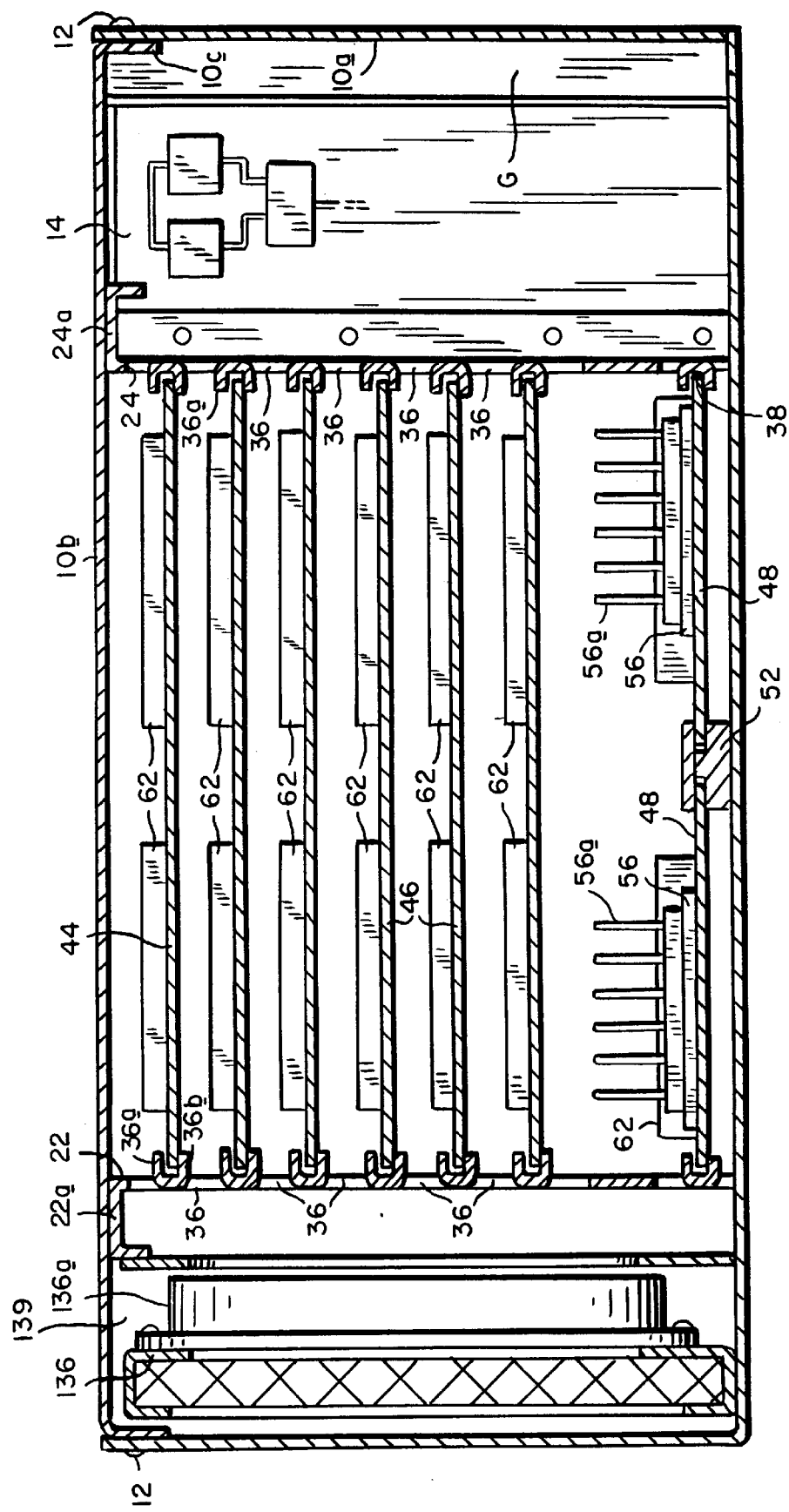
FIG. 5 is a sectional view taken along line 5—5 of FIG. 4.

As best seen in FIGS. 3 to 5, each of the card guides 22, 24, 28 and 30 is formed with at least one column of relatively large, generally rectangular slots 36. In the illustrated chassis embodiment, the card guides 22 and 24 in the front compartment 16 have three columns of slots 36, the corresponding slots in each column being in horizontal alignment. On the other hand, the card guides 26 and 28 in the rear compartment 18 each have only a single column of slots.

Preferably, the adjacent horizontal edges 36a and 36b of the adjacent slots in each column are rolled toward one another to form lips that create slides 38 between adjacent slots 36, with the corresponding slides 38 in the columns of slots being in horizontal alignment. Thus, the card guides 22 and 24 define a vertical set of horizontal slides in compartment 16, while the card guides 28 and 30 define a vertical set of slides in compartment 18, all of which slides are aligned precisely with selected locations on the motherboard 14.

The card guides 22 and 24 are provided with upper flanges 22a and 24a to which cover 10b may be secured by suitable threaded fasteners 42 (FIG. 1). Similar flanges at the lower edges of those card guides are secured by fasteners 25 to the bottom wall of channel 10a as noted above. There are also upstanding flanges 22b and 24b at the front edges of those card guides located adjacent the front edge of channel 10a.

The card guides 28 and 30 in the rear compartment 18 may be also provided with top flanges to which the cover 10b may be fastened by fasteners 42 and upstanding rear flanges 28b and 30b. Thus, when the cover 10b is in place, the mid-plane and all of the card guides are rigidly retained in perpendicular alignment within the housing 10 and flanges 22b, 24b and 28b, 30b are exposed at the front and rear of the chassis, respectively.

As shown in FIGS. 3 to 5, the card guides 22 and 24 in the front compartment 16 are arranged to support a stack of printed circuit cards in spaced parallel relation. In the illustrated switch, there are cards 44 in the two uppermost positions in compartment 16, each carrying a central processor unit (CPU), while the cards 46 further down in the stack may be line cards which carry expandable switch integration components such as Exnet interfaces. Also, depending upon the desired switching capacity for the switch one or more of the card positions may be left unused or more desirably, filled with a blank or "dummy" card.

Preferably, the lowest position in compartment 16 is reserved for a pair of identical DC power supply 48 cards to provide redundancy. These cards may be used together or alternatively depending upon the circumstances. Since the power supply cards are only half the width of the lowermost slot in compartment 16, a fore and aft-extending guide rail 52 is mounted to the bottom wall of channel 10a to support the adjacent inner edges of the two cards 48. The guide rail 52 extends substantially the entire length of compartment 16 so that the cards are supported along their entire lengths. Each card 48 carries a solid state power supply 56 which tends to become hot when in use. Therefore, a heat sink 56a is positioned flush against the power supply to help dissipate the heat. As will be seen, air is circulated quite efficiently through the housing 10 in order to cool the power supplies and the other electrical components in the housing 10.

Also, as shown in FIGS. 3 to 6A, each printed circuit card 44, 46 and 48 carries at least one end connector 62 which projects beyond its rear edge. That connector is adapted to plug into a corresponding card connector 64 on the mid-plane 14 when the card is slid home to its proper position in compartment 16 thereby connecting the electrical components on the card to the routing circuitry on the mid-plane so that all of the switch components are interconnected correctly. As best seen FIGS. 4 and 6A, a pin 66 projects from the opposite ends of each card connector 64. These pins are arranged to project into spring clips 68 at the opposite ends of the corresponding card end connector 62 to facilitate the desired alignment of the two connectors. The pins are usually "hot" so that they precharge the boards as they align the boards.

Figure 6B:
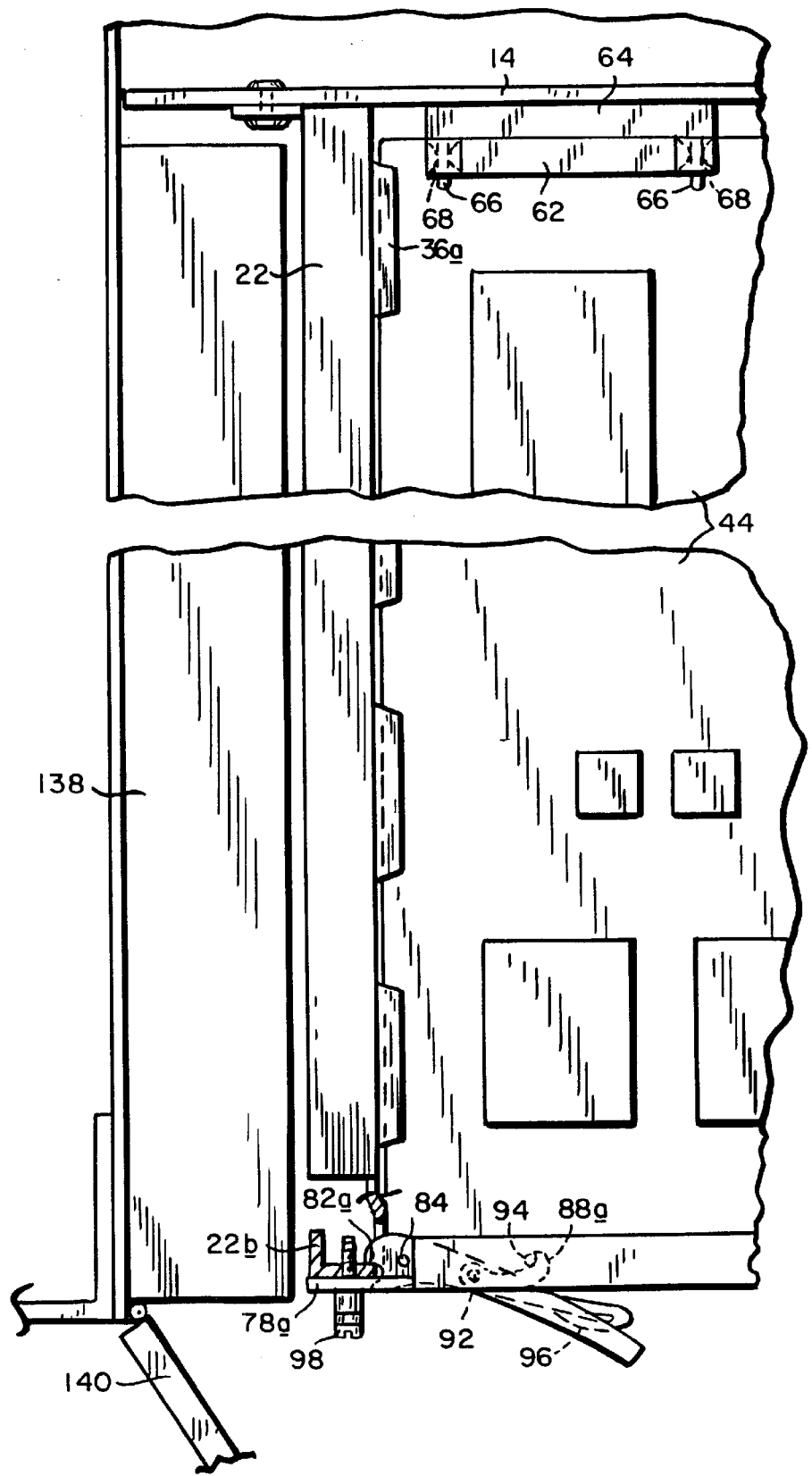

As shown in FIGS. 3, 6A and 6B, means are provided for locking each printed circuit card 44 and 46 in place within compartment 16. More particularly, each card 44 and 46 is provided with a channel-like bracket 78 which is secured to the front edge of the card. The brackets may support connectors 79 and various indicator lamps 80 for monitoring the operation of the switch. Tabs 78a at the opposite ends of each bracket extend beyond the side edges of the card so that when the card is seated in its slot position in compartment 16, the tabs overlap the front flanges 22b, 24b of the corresponding card guide 22, 24. Thus, FIG. 6A shows the tab 78a of the bracket 78 on the uppermost card 44 overlapping the flange 22b of the right hand card guide 22. A similar arrangement prevails at the opposite side of the card.

A pair of mirror-image lever arms 82 are connected by pivots 84 to the front edge of each full width printed circuit card 44 and 46, adjacent the opposite side edges thereof. Each lever arm has a notch 82a at its rear end and the arm is swingable about its pivot 84 between a releasing position shown in FIG. 6A wherein the lever extends fore and aft and the notch 82a is spaced from the corresponding card guide 22, 24 and a locking position illustrated in FIG. 6B wherein the lever 82 extends transversely and the lever end with notch 82a engages behind the forward edge of a small opening 86 (FIGS. 3 and 4) provided in the associated card guide 22, 24.

The power supply cards 48, being only half as wide as cards 44, 46, have no bracket 78 and only a single lever arm 82.

When seating a card 44, 46, 48, the lever arm(s) 82 on the card is moved to its releasing position shown in FIG. 6A and the card is slid toward its home position against the mid-plane 14 until the pins 66 in the card connector 64 for that card engage the clips 68 on that card's end connector 62. At that point, the lever arm(s) 82 is in position to be swung to the locking position shown in FIG. 6B wherein the notched end of the lever arm engages in the opening 86 in the associated card guide. Movement of the lever arm toward its locking position jacks the card rearwardly forcing the pins 66 to penetrate the spring clips 68 which guide the end connector 62 into mating engagement with the corresponding card connector 64 on the mid-plane 14. This assures that good electrical connections are made between all of the contacts or terminals of the two matched connectors.

As best seen in FIGS. 6A and 6B, each lever 82 carries a generally V-shaped retainer means in the form of a rocker 88 which is connected to the lever arm at the base of the V by a pivot 92. The end of the rocker 88 facing the lever notch 82a is formed with a nose 88a. When the lever arm 82 is moved to its locking position shown in FIG. 6B, the nose 88a engages around a pin 94 extending through the associated printed circuit card 44, 46 or 48. A leaf spring 96 extending between the rocker 88 and the lever arm 82 biases nose 88a against pin 94 thus maintaining lever arm 82 in its FIG. 6B locking position. The lever arm 82 is released from its locking position by pinching the rocker and lever arm together so that the nose 88a swings away from pin 94 allowing the lever arm 82 to pivot to its releasing position shown in FIG. 6A.

As a further safety precaution, threaded fasteners 98 may be mounted to the tabs 78a of cards 44 and 46 so that when each card is in its home position in the switch chassis, the fasteners can be turned down into threaded openings 102 (FIG. 6A) in the front flanges 22b and 24b of the card guides 22 and 24.

Since the power supply cards 48 include components which have high operating temperatures and carry high voltages, special precautions are taken to isolate those cards. More particularly, and as shown in FIGS. 1 and 3, a removable door or panel 106 is connected by clips 108 at its opposite ends to the flanges 22b,24b of card guides 22, 24. The door is tall enough to cover the opening into the lowest card position in the compartment 16 of the chassis. The door may be removed as shown in FIG. 3 which allows the power cards 48 to be withdrawn from the chassis.

Referring now to FIGS. 3 and 4, as noted above, the card guides 28 and 30 in the rear compartment 18 also have slots 36. Since compartment 18 has less rearward extent than compartment 16, there is only a single column of slots 36. Positioned between the slots 36 are two columns of slides 38. These slides may be somewhat different from slides 38 in the front compartment in that they may be struck from the card guide material between the slots 36 rather than being formed by the rolled over edges of those slots. In any event, the slides function in the same way as slides 38 to support a stack of printed circuit cards in vertically spaced relation in compartment 18. In the illustrated switch, the top two cards 110 are CPU input/output cards, with the remaining cards 112 being line cards to which communications lines may be connected.

Each card 110, 112 carries at least one end connector 114 which is arranged to mate with a corresponding connector 116 mounted to the rear face of the mid-plane 14. The connectors 114 and 116 are similar to the connectors 62 and 64 described above and operate in the same way to interconnect the components on the printed circuit cards 110, 112 with each other and with the components on cards 44, 46 and 48.

As shown in FIGS. 2 and 3, mounted to the exposed rear edges of cards 110, 112 are brackets 122 which are similar to the brackets 78 described above. These brackets 122 carry different types of connectors 124a–124e at which various electrical signals may be coupled to and from the switch. Cards 110, 112 are also provided with lever arms 126 similar to lever arms 82 described above by which the cards 110, 112 may be locked in position within compartment 18. Each card may also be provided with threaded fasteners similar to fasteners 98 to further secure the cards in place.

The lowest space in compartment 18 behind the power supply cards 48 is reserved for wiring to and from circuit breaker switches 128 mounted to a panel 132 secured to card guides 28 and 30 below the lowest card position in compartment 18.

When the printed circuit cards 110, 112 are seated in compartment 18, the spaces between the cards are aligned with the slots 36 in the card guides 28 and 30 so that air is free to circulate from the space 34 at the left side of compartment 18 between the printed circuit cards to a space 135 between the card guide 28 and the right hand wall of housing channel 10a. That space is vented to the atmosphere through a perforate panel 136 secured by fasteners 137 to the bottom wall of channel 10a and to cover 10b.

As best seen in FIGS. 3 and 5, the components of the switch are cooled by a fan module 138 removably positioned in a utility space 139 outboard the card guide 22. Space 139 is accessible through an opening at the front of the chassis. That opening may be closed by perforate door 140 connected by hinge 142 to the adjacent sidewall of channel 10a. Door 140 may be releasably locked in its closed position by a pair of threaded fasteners 144 which, when the door is closed, may be turned down into threaded holes 146 in the flange 22b of card guide 22.

The fan module 138 consists of two high pressure fans 138a which receive power from the mid-plane 14. When the fans are in operation, they draw air into the chassis through the openings in door 140 and direct high pressure air laterally across compartment 16 so that the air is circulated around and across the components on the cards in that compartment, particularly the components on the power supply cards 48. That cooling air flows into the plenum 32 and rearwardly through the gap G into the space 34 in the rear compartment 18. Thence, the air is directed laterally between the printed circuit cards 1 10 and 112 in the rear compartment to the space 135 whence the air exits the chassis through the perforate panel 136 at the rear of the chassis. Thus, the cooling air follows a generally U-shaped path through the chassis so that it assuredly reaches all of the components comprising the switch. Thus, there is little chance of the switch components overheating when the switch is in use. The space 135 may also accommodate a fan or blower to increase the air flow and provide redundancy.

As seen from the foregoing, the above-described chassis construction achieves the objectives of the invention in that it allows for the relatively dense packing of a multiplicity of printed circuit cards, including power supply cards, while assuring that the various electrical components on the printed circuit cards are efficiently cooled when the switch is in use. At the same time, the self-aligning junction of the card guides and mid-plane ensures that when printed circuit cards are inserted into the chassis, they will slide smoothly into position and make reliable electrical connections to the mid-plane. Yet, the chassis is still relatively inexpensive to make. In particular, the card guides can be simple stamped metal parts and be made relatively easily using standard computer-aided manufacturing techniques. Furthermore, the assembly of the chassis can be readily accomplished without requiring any special tools or other equipment.

It will thus be seen that the objects set forth above, among those made apparent from the preceding description, are efficiently attained. Also, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention described herein.

What is claimed is:

1. A telecommunications switch chassis comprising:

a generally rectangular housing having front and rear ends, a bottom wall and opposite sidewalls extending between said ends;

a transverse printed circuit board constituting a mid-plane positioned in the housing between said ends, said circuit board having opposite ends one of which is adjacent one housing sidewall and the other of which is spaced from the other housing sidewall by a gap thereby dividing the housing interior into front and rear compartments;

a plurality of card connectors mounted to the opposite faces of the printed circuit board;

a pair of laterally spaced apart parallel card guides extending from the circuit board substantially to the front end of the housing, each card guide being spaced from an adjacent housing sidewall to provide a pair of utility spaces between the card guides and the housing sidewalls;

means defining at least one column of slots in each of the card guides;

at least one column of parallel card slides interleaved with the slots in each card guide, said slides being perpendicular to the printed circuit board and the corresponding slides in the pair of card guides being at the same level in the front compartment so that when printed circuit cards having end connectors are slid along the corresponding slides in the pair of card guides until they substantially abut the printed circuit board, the cards will be supported at vertically spaced card positions in the front compartment and their connectors will couple to the card connectors of the printed circuit board, and an air circulator positioned in the utility space located adjacent to said one end of the printed circuit board, said circulator being positioned to direct cooling air across the front compartment so that the air passes through the slots in the card guides and between the cards supported by the card guides to the other utility space whereupon the air flows around said other end of the printed circuit board into the rear compartment.

2. The chassis defined in claim 1 and further including interfitting means on each card guide and on the printed circuit board for bringing the card guides into proper alignment with the printed circuit board.

3. The chassis defined in claim 2 wherein the intermitting means comprise at least one tab on the rear end of each card guide which is received in a slot in the printed circuit board.

4. The chassis defined in claim 1 wherein the slots in each card guide have edges which are bent to form lips which constitute said card slides.

5. The chassis defined in claim 1 wherein the air circulator is a fan module removably positioned in said one utility space and connected electrically to the printed circuit board.

6. The chassis defined in claim 5 and further including a perforate door at the front of the housing which opens into and vents said one utility space.

7. The chassis defined in claim 1 and further including a rail mounted to the housing bottom wall, said rail extending from the printed circuit board substantially to the front end of the housing parallel to the card slides, said rail being adapted to slidably support the adjacent edges of a pair of side-by-side power supply cards whose opposite edges are slidably supported by the lowest card slides in the card guides.

8. The chassis defined in claim 7 and further including a protective door attached to the front of the housing at a position to block access to the lowest card slides.

9. The chassis defined in claim 1 and further including printed circuit cards supported at selected card positions in the front compartment, each card having a front end and a rear end connector coupled to a corresponding one of said connectors on one face of the printed circuit board.

10. The chassis defined in claim 9 and further including coacting means on the front end of each printed circuit card and at least one card guide for releasably locking each card slidably supported by the card guides to said at least one card guide.

11. The chassis defined in claim 10 wherein the coacting means include an edge of said at least one card guide and a lever arm pivotally mounted to each printed circuit card and swingable between a locking position wherein the lever arm engages said edge and jacks the card rearwardly toward the printed circuit board and a releasing position wherein the lever arm is disengaged from said at least one card guide, and means for releasably retaining the lever arm in its locking position.

12. The chassis defined in claim 11 wherein the coacting means also include at least one threaded hole in said at least one card guide, and a threaded fastener on the front end of the printed circuit card which may be screwed into said threaded hole.

13. The chassis defined in claim 1 and further including a vent opening into said second compartment behind said one utility space;

a second pair of laterally spaced apart parallel card guides extending from the printed circuit board substantially to the rear end of the housing, said second pair of card guides being spaced from the housing slide walls and having interleaved slots and card slides therein similar to those in the first pair of card guides so that when printed circuit cards having end connectors are slid along the corresponding slides in the second pair of card guides until the cards substantially abut the printed circuit board, the cards will be supported at vertically spaced positions in the rear compartment and the end connectors on the cards will be coupled to card connectors on the printed circuit board whereby air entering the rear compartment from the front compartment through said gap will be directed through the slots in the second pair of card guides and between the printed circuit cards supported in the rear compartment, and a vent opening from the second compartment behind said one utility space so that the air from the air circulator follows a generally U-shaped path through the chassis.

14. The chassis defined in claim 13 and further including a plurality of additional printed circuit cards supported at selected card positions in the rear compartment, each additional card having a rear end and a front end connector coupled to a corresponding one of said card connectors on the other face of the printed circuit board.

15. The chassis defined in claim 14 and further including coacting means on the rear end of each additional printed circuit card and at least one card guide of the second pair of card guides for locking each additional printed circuit card to said at least one card guide of the second pair of card guides.

16. The chassis defined in claim 13 and further including a fan located in said second compartment adjacent to said vent opening for discharging air through said vent opening.

* * * * *

UNITED STATES PATENT AND TRADEMARK OFFICE
CERTIFICATE OF CORRECTION

PATENT NO. : 5,912,801

DATED : June 15, 1999

INVENTOR(S) : Christopher E. Roy, Kathleen M. Lacey, Lori B. Pass

It is certified that error appears in the above-identified patent and that said Letters Patent is hereby corrected as shown below:

On the Title Page, Item [73] Assignee, should read ----- Excel Switching Corporation ----.

Signed and Sealed this

Twenty-second Day of May, 2001

Attest:

NICHOLAS P. GODICI

*Attesting Officer*      *Acting Director of the United States Patent and Trademark Office*